(12) United States Patent
Chiu et al.

(10) Patent No.: US 12,500,181 B2
(45) Date of Patent: Dec. 16, 2025

(54) ELECTRONIC PACKAGE AND MANUFACTURING METHOD THEREOF

(71) Applicant: SILICONWARE PRECISION INDUSTRIES CO., LTD., Taichung (TW)

(72) Inventors: Chih-Hsien Chiu, Taichung (TW); Wen-Jung Tsai, Taichung (TW); Chih-Chiang He, Taichung (TW); Ko-Wei Chang, Taichung (TW); Chia-Yang Chen, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 417 days.

(21) Appl. No.: 18/165,044

(22) Filed: Feb. 6, 2023

(65) Prior Publication Data
US 2024/0145403 A1 May 2, 2024

(30) Foreign Application Priority Data
Nov. 1, 2022 (TW) .................................. 111141609

(51) Int. Cl.
*H01L 23/552* (2006.01)
*H01L 21/56* (2006.01)
(Continued)

(52) U.S. Cl.
CPC ............ *H01L 23/552* (2013.01); *H01L 21/56* (2013.01); *H01L 25/0652* (2013.01); *H01L 25/105* (2013.01); *H01L 25/16* (2013.01); *H01L 25/50* (2013.01); *H01L 24/16* (2013.01); *H01L 24/48* (2013.01); *H01L 2224/16225* (2013.01); *H01L 2224/48091* (2013.01); *H01L 2224/48227* (2013.01)

(58) Field of Classification Search
CPC ... H01L 23/552; H01L 21/56; H01L 25/0652; H01L 25/105; H01L 25/16; H01L 25/50; H01L 24/16; H01L 24/48; H01L 2224/16225; H01L 2224/48091; H01L 2224/48227; H01L 23/3121; H01L 23/3135; H01L 23/3128; H01L 21/50; H01L 23/3107
See application file for complete search history.

(56) References Cited

U.S. PATENT DOCUMENTS 7,049,682 B1 * 5/2006 Mathews .............. H01L 23/552
257/659
8,093,691 B1 * 1/2012 Fuentes ................... H01L 24/97
257/659
(Continued)

*Primary Examiner* — Bitew A Dinke
(74) *Attorney, Agent, or Firm* — Studebaker Brackett PLLC

(57) ABSTRACT

An electronic package is provided, in which electronic elements and at least one packaging module including a semiconductor chip and a shielding structure covering the semiconductor chip are disposed on a carrier structure, an encapsulation layer encapsulates the electronic elements and the packaging module, and a shielding layer is formed on the encapsulation layer and in contact with the shielding structure. Therefore, the packaging module includes the semiconductor chip and the shielding structure and has a chip function and a shielding wall function simultaneously.

18 Claims, 6 Drawing Sheets

(51) Int. Cl.
  *H01L 25/00*   (2006.01)
  *H01L 25/065*  (2023.01)
  *H01L 25/10*   (2006.01)
  *H01L 25/16*   (2023.01)
  *H01L 23/00*   (2006.01)

(56) References Cited

U.S. PATENT DOCUMENTS

| | | | | |
|---|---|---|---|---|
| 10,910,286 B2* | 2/2021 | Luo | ............... | H01L 23/552 |
| 2002/0167060 A1* | 11/2002 | Buijsman | ............... | H01L 23/552 |
| | | | | 257/E23.114 |
| 2009/0236700 A1* | 9/2009 | Moriya | ............... | H01L 24/49 |
| | | | | 257/E23.116 |
| 2010/0027225 A1* | 2/2010 | Yuda | ............... | H05K 3/4697 |
| | | | | 156/247 |
| 2011/0006408 A1* | 1/2011 | Liao | ............... | H01L 21/561 |
| | | | | 257/E23.114 |
| 2011/0298103 A1* | 12/2011 | Yoo | ............... | H01L 23/552 |
| | | | | 257/659 |
| 2012/0218729 A1* | 8/2012 | Carey | ............... | H01L 23/49541 |
| | | | | 361/807 |
| 2012/0228749 A1* | 9/2012 | Pagaila | ............... | H01L 21/56 |
| | | | | 257/659 |
| 2012/0228751 A1* | 9/2012 | Song | ............... | H01L 24/06 |
| | | | | 438/109 |
| 2013/0093629 A1* | 4/2013 | Chiu | ............... | H01Q 1/521 |
| | | | | 343/700 MS |
| 2014/0126161 A1* | 5/2014 | Chen | ............... | H01L 23/552 |
| | | | | 361/748 |
| 2015/0264797 A1* | 9/2015 | Happoya | ............... | H05K 1/0222 |
| | | | | 361/783 |
| 2016/0027740 A1* | 1/2016 | Chiu | ............... | H01L 23/3128 |
| | | | | 257/659 |
| 2016/0240493 A1* | 8/2016 | Lee | ............... | H01L 23/3128 |
| 2017/0200682 A1* | 7/2017 | Lin | ............... | H01L 24/97 |
| 2017/0358540 A1* | 12/2017 | Min | ............... | H01L 23/295 |
| 2018/0040568 A1* | 2/2018 | Jian | ............... | H01L 25/16 |
| 2018/0158779 A1* | 6/2018 | Yang | ............... | H01L 23/5389 |
| 2019/0006288 A1* | 1/2019 | Wang | ............... | H01L 21/6835 |
| 2019/0103365 A1* | 4/2019 | Singh | ............... | H01L 23/552 |
| 2019/0206813 A1* | 7/2019 | Kim | ............... | H01L 23/12 |
| 2019/0244907 A1* | 8/2019 | Liao | ............... | H01L 23/5389 |
| 2019/0333865 A1* | 10/2019 | Choi | ............... | H01L 23/49838 |
| 2019/0348371 A1* | 11/2019 | Fang | ............... | H01L 23/552 |
| 2019/0363030 A1* | 11/2019 | Yazaki | ............... | H01L 23/15 |
| 2021/0193587 A1* | 6/2021 | Yada | ............... | H01L 23/552 |
| 2021/0202409 A1* | 7/2021 | Kung | ............... | H01L 24/16 |
| 2021/0398912 A1* | 12/2021 | Park | ............... | H01L 23/5286 |
| 2022/0285287 A1* | 9/2022 | Tao | ............... | H01L 24/03 |
| 2023/0092873 A1* | 3/2023 | Liu | ............... | H01L 23/49811 |
| | | | | 257/659 |
| 2024/0234335 A1* | 7/2024 | Chu | ............... | H01L 21/56 |

\* cited by examiner

ELECTRONIC PACKAGE AND MANUFACTURING METHOD THEREOF

BACKGROUND

1. Technical Field

The present disclosure relates to a semiconductor packaging structure, and more particularly, to an electronic package with shielding mechanism and manufacturing method thereof.

2. Description of Related Art

With the evolution of semiconductor technology, various semiconductor products, in particular for products of system in package (SiP), have shielding functions to prevent electromagnetic interference (EMI) in order to improve the electrical quality.

As shown in FIG. 1A, in a conventional semiconductor package 1, a plurality of semiconductor chips 11 are disposed on a packaging substrate 10, and a packaging compound 13 is used to encapsulate each of the semiconductor chips 11. Then, a shielding layer 14 made of a metal material is formed on the surfaces of the packaging compound 13 and the side surfaces of the packaging substrate 10, such that the shielding layer 14 can protect the plurality of semiconductor chips 11 from being affected by the external EMI. Further, at least one shielding wall 12 made of a metal material can be disposed around the plurality of semiconductor chips 11, such that the shielding wall 12 can be used to prevent mutual electromagnetic wave (or signal) interference between the plurality of semiconductor chips 11.

In the aforementioned semiconductor package 1, as shown in FIG. 1B, a metal frame can be fabricated first and then adhered on the packaging substrate 10 in the manufacturing process of the shielding wall 12. Alternatively, a through hole is formed in the packaging compound 13, and then a metal material is electroplated in the through hole, such that the metal material is used as the shielding wall 12.

Besides, due to that the end products, in particular for products of SiP, are designed toward miniaturization, the area of a surface 10a of the packaging substrate 10 is also reduced accordingly. However, the shielding wall 12 needs to be disposed on the surface 10a of the packaging substrate 10; therefore, the shielding wall 12 not only occupies a portion of the area of the surface 10a of the packaging substrate 10 (so that the packaging substrate 10 cannot be further reduced), but also occupies the region that can be used for routing/wiring on the surface 10a of the packaging substrate 10, so that the wiring of the packaging substrate 10 is limited and the product functions cannot be further improved.

Therefore, how to overcome the aforementioned drawbacks of the prior art has become an urgent issue to be addressed at present.

SUMMARY

In view of the various shortcomings of the prior art, the present disclosure provides an electronic package, comprising: a carrier structure; an electronic element disposed on and electrically connected to the carrier structure; a packaging module disposed on and electrically connected to the carrier structure, wherein the packaging module comprises a semiconductor chip and a shielding structure covering at least one side of the semiconductor chip; an encapsulation layer formed on the carrier structure and encapsulating the electronic element and the packaging module, wherein a portion of a surface of the shielding structure is exposed from the encapsulation layer; and a shielding layer formed on the encapsulation layer and in contact with the portion of the surface of the shielding structure exposed from the encapsulation layer.

The present disclosure also provides a method of manufacturing an electronic package, comprising: disposing an electronic element and a packaging module on a carrier structure, wherein the electronic element and the packaging module are electrically connected to the carrier structure, wherein the packaging module comprises a semiconductor chip and a shielding structure covering at least one side of the semiconductor chip; forming an encapsulation layer on the carrier structure, wherein the encapsulation layer encapsulates the electronic element and the packaging module, wherein a portion of a surface of the shielding structure is exposed from the encapsulation layer; and forming a shielding layer on the encapsulation layer, wherein the shielding layer is in contact with the portion of the surface of the shielding structure exposed from the encapsulation layer.

In the aforementioned electronic package and method, the packaging module further comprises a packaging layer encapsulating the semiconductor chip, wherein the shielding structure is formed on the packaging layer, and the packaging module is disposed on the carrier structure via a plurality of conductive elements. Further, the packaging module further comprises a substrate structure or a circuit structure carrying the semiconductor chip, wherein the substrate structure or the circuit structure is disposed on the carrier structure via the plurality of conductive elements.

In the aforementioned electronic package and method, a plurality of the packaging modules are disposed on the carrier structure.

In the aforementioned electronic package and method, a plurality of functional chips are disposed on the carrier structure, wherein the packaging module is disposed between the plurality of functional chips, and the packaging module is served as a shielding wall between the plurality of functional chips.

In the aforementioned electronic package and method, the encapsulation layer has at least one recess exposing the shielding structure. For instance, the encapsulation layer has a plurality of recesses exposing the shielding structure.

In the aforementioned electronic package and method, an upper surface of the encapsulation layer is flush with an upper surface of the shielding structure.

In the aforementioned electronic package and method, the shielding structure surrounds side surfaces of the semiconductor chip and is free from being disposed over the semiconductor chip.

In the aforementioned electronic package and method, the shielding structure comprises at least one metal layer.

As can be understood from the above, in the electronic package and manufacturing method thereof of the present disclosure, the packaging module has a semiconductor chip and a shielding structure and is served as a shielding wall. Therefore, compared to the prior art, the packaging module of the electronic package of the present disclosure can replace the conventional shielding wall, so that the packaging module does not additionally occupy the packaging planar region of the carrier structure, such that the dimension of the carrier structure can be reduced and the electronic package can meet the miniaturization requirements while reducing the area occupied on the routing region of the carrier structure, thereby improving the functions of the end products.

BRIEF DESCRIPTION OF THE DRAWINGS

FIG. 2A-2 is a schematic partial top plan view showing another embodiment of FIG. 2A-1.

FIG. 2C-2 and FIG. 2C-3 are schematic cross-sectional views showing other aspects of FIG. 2C-1.

FIG. 2D-2, FIG. 2D-3 and FIG. 2D-4 are schematic cross-sectional views showing other aspects of FIG. 2D-1.

DETAILED DESCRIPTIONS

Figure 1A:
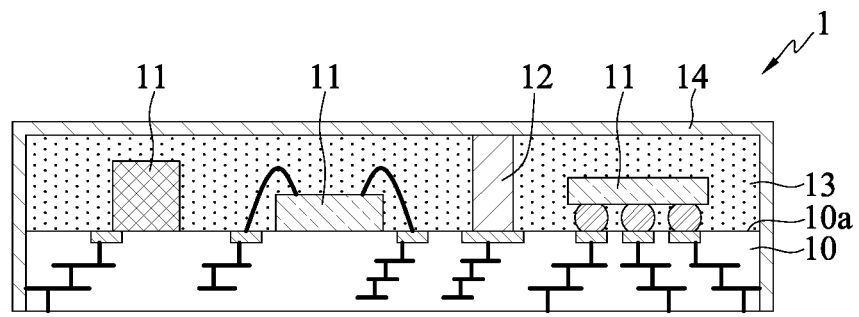
FIG. 1A is a schematic cross-sectional view of a conventional semiconductor package.
Figure 1B:
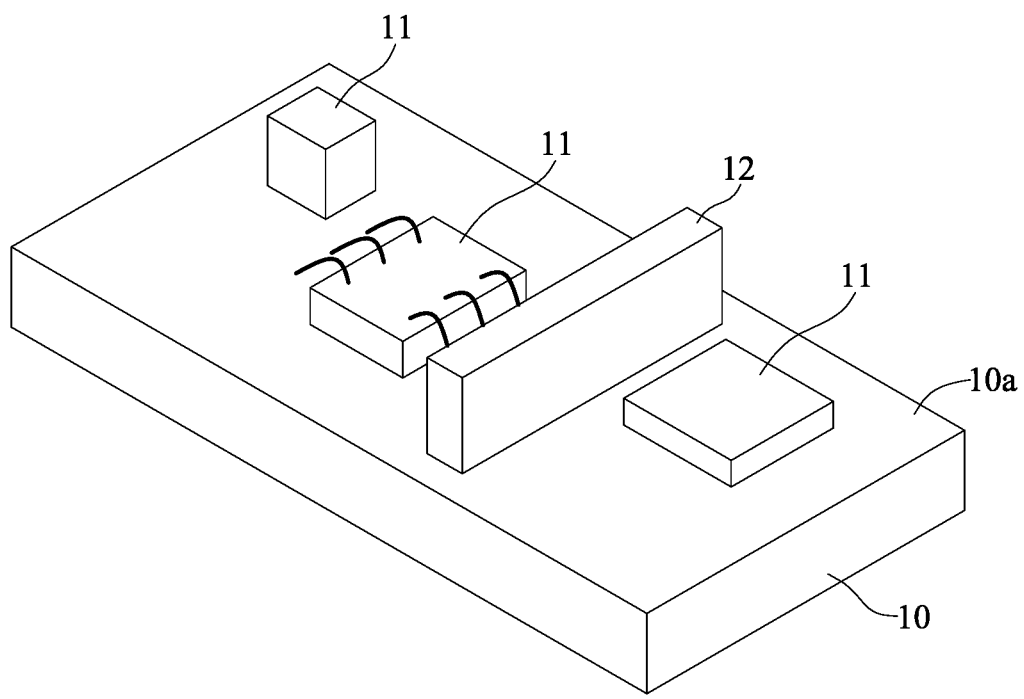
FIG. 1B is a schematic partial perspective view of FIG. 1A.

Implementations of the present disclosure are illustrated using the following embodiments. One of ordinary skill in the art can readily appreciate other advantages and technical effects of the present disclosure upon reading the content of this specification.

It should be noted that the structures, ratios, sizes, etc. shown in the drawings appended to this specification are to be construed in conjunction with the disclosure of this specification in order to facilitate understanding of those skilled in the art. They are not meant to limit the implementations of the present disclosure, and therefore have no substantial technical meaning. Any modifications of the structures, changes of the ratio relationships, or adjustments of the sizes, are to be construed as falling within the range covered by the technical content disclosed herein to the extent of not causing changes in the technical effects created and the objectives achieved by the present disclosure. Meanwhile, terms such as "on," "first," "second," "one," "a," and the like recited herein are for illustrative purposes, and are not meant to limit the scope in which the present disclosure can be implemented. Any variations or modifications to their relative relationships, without changes in the substantial technical content, should also to be regarded as within the scope in which the present disclosure can be implemented.

FIG. 2A-1, FIG. 2B, FIG. 2C-1 and FIG. 2D-1 are schematic cross-sectional views illustrating a method of manufacturing an electronic package 2 according to the present disclosure.

Figures 1, 2A:
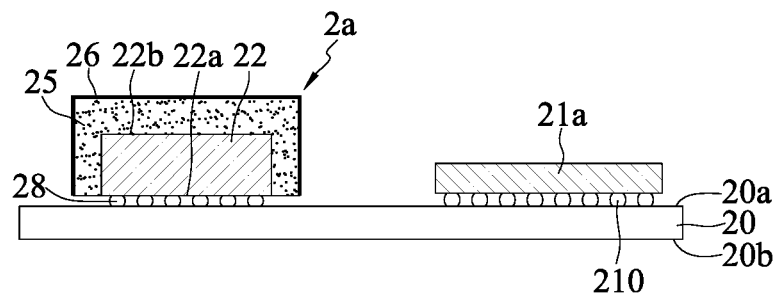
FIG. 2A-1, FIG. 2B, FIG. 2C-1 and FIG. 2D-1 are schematic cross-sectional views illustrating a method of manufacturing an electronic package according to the present disclosure.

As shown in FIG. 2A-1, at least one packaging module 2a and at least one electronic element 21a are disposed on a carrier structure 20, and the packaging module 2a and the electronic element 21a are both electrically connected to the carrier structure 20.

The carrier structure 20 is for example a packaging substrate with a core layer and a circuit structure or a coreless circuit structure, and at least a circuit layer (not shown) such as a fan-out type redistribution layer (RDL) is formed on an insulating material (not shown). It should be understood that the carrier structure 20 can also be other types of plate for carrying chips, such as a wafer, a plate body with metal routings, etc., and the present disclosure is not limited to the above.

In an embodiment, the carrier structure 20 has a first side 20a and a second side 20b opposing the first side 20a. The material for forming the circuit layer is copper, and the insulating material is a dielectric material such as polybenzoxazole (PBO), polyimide (PI), prepreg (PP), or the like, or a solder-resist material such as solder mask (e.g., green paint), graphite (e.g., ink), or the like.

The electronic element 21a is disposed on the first side 20a of the carrier structure 20, and the electronic element 21a is an active element, a passive element, or a combination of the active element and the passive element, etc., wherein the active element is for example a semiconductor chip, and the passive element is for example a resistor, a capacitor, or an inductor.

In an embodiment, the electronic element 21a is an active element, such as a functional chip. The electronic element 21a can be electrically connected to the circuit layer of the carrier structure 20 by flip-chip method (conductive bumps 210 as shown in the figures), wire-bonding method, direct contact with the circuit layer, or other suitable means, and the present disclosure is not limited to as such.

Figures 2, 2A:
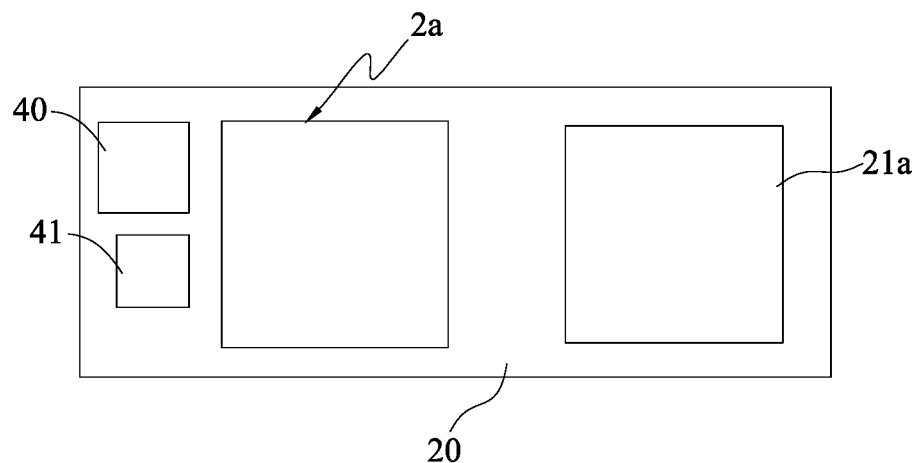

In addition, an active element 40, such as a functional chip shown in FIG. 2A-2, can be carried or disposed on the first side 20a of the carrier structure 20.

The packaging module 2a comprises at least one semiconductor chip 22, a packaging layer 25 encapsulating the semiconductor chip 22, and a shielding structure 26 formed on the packaging layer 25.

In an embodiment, the packaging module 2a is in an aspect of chip scale package (CSP). For instance, the semiconductor chip 22 has an active surface 22a and an inactive surface 22b opposing the active surface 22a, and a plurality of electrode pads (not shown) are disposed on the active surface 22a to bond with conductive elements 28 containing solder material, such that the packaging module 2a is disposed onto the circuit layer of the first side 20a of the carrier structure via the conductive elements 28, and the packaging module 2a is electrically connected to the carrier structure 20.

Moreover, the packaging layer 25 is made of an insulating material such as polyimide (PI), dry film, encapsulation colloid such as epoxy resin, or molding compound, but the present disclosure is not limited to as such.

Additionally, there are various types of the packaging module 2a, and the present disclosure does not limit the type of the packaging module 2a. In a flip-chip (FC) CSP aspect or a fan-out (FO) type wafer level chip scale packaging (WLCSP) aspect shown in FIG. 3A, a packaging module 3a can comprise a substrate structure 27 for carrying the semiconductor chip 22. For example, the substrate structure 27 is a packaging substrate with a core layer and a circuit structure, a packaging substrate with a coreless circuit structure, a through-silicon interposer (TSI) with through-silicon vias (TSVs), or of other types of plate. The substrate structure 27 includes at least one insulating layer and at least one circuit layer bonded to the insulating layer, so that the semiconductor chip 22 is electrically connected to the circuit layer of the substrate structure 27 via a plurality of conductive bumps 220 in a flip-chip manner, and the substrate structure 27 is disposed on the carrier structure 20 via the plurality of conductive elements 28.

Figure 3A:
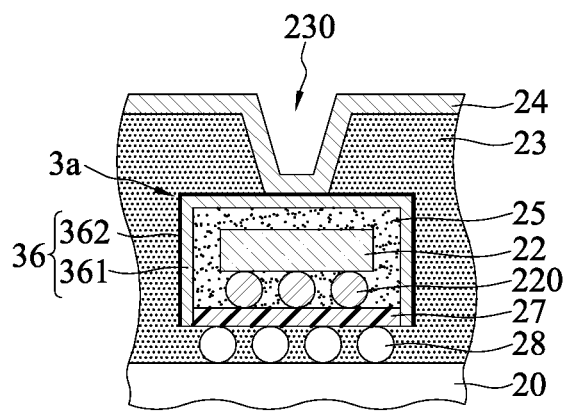
FIG. 3A, FIG. 3B and FIG. 3C are schematic cross-sectional views showing other embodiments of FIG. 2D-1.
Figure 3B:
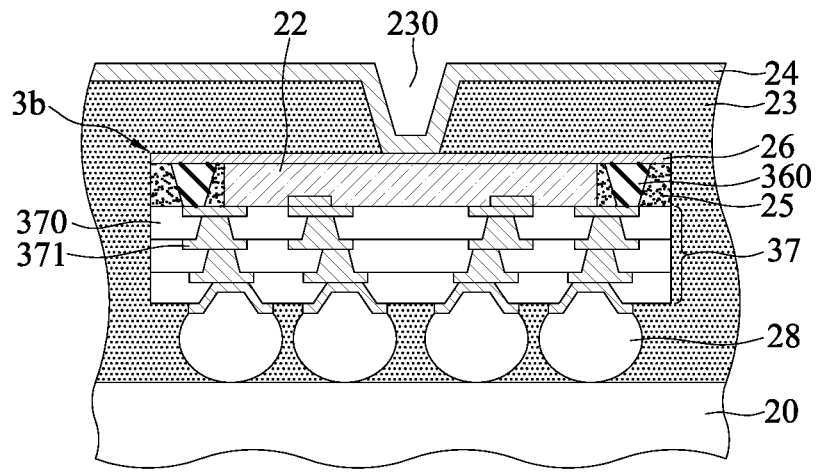

Alternatively, in a WLCSP aspect shown in FIG. 3B, a packaging module 3b can comprise a circuit structure 37 for carrying the semiconductor chip 22. The circuit structure 37 is for example of a coreless type and comprises at least one insulating layer 370 and at least one circuit layer 371 bonded to the insulating layer 370, so that the semiconductor chip 22 is in direct contact with the circuit layer 371 of the circuit structure 37 to electrically connect the circuit layer 371 of the circuit structure 37, and the circuit structure 37 is disposed on the carrier structure 20 via the plurality of conductive elements 28.

Figure 3C:
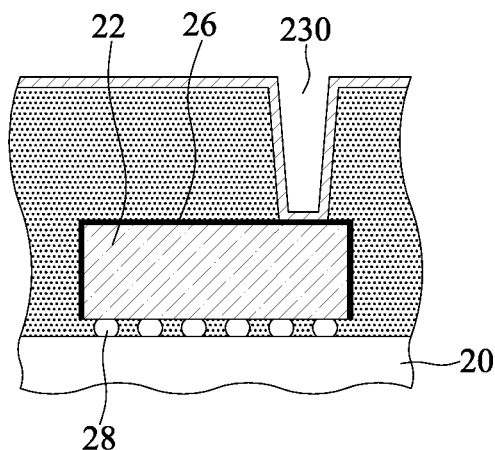

Furthermore, in an aspect of fan-in (FI) type WLCSP shown in FIG. 3C, the shielding structure 26 is directly formed on the semiconductor chip 22 without fabricating the packaging layer 25.

Figure 4A:
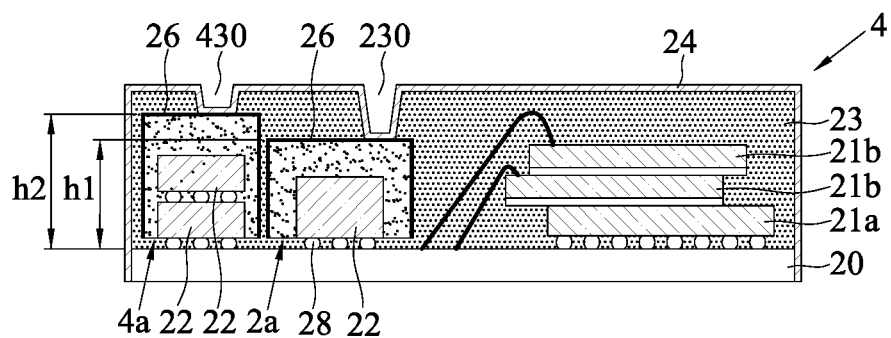
FIG. 4A is a schematic cross-sectional view showing another embodiment of FIG. 2D-1.

As shown in FIG. 4A, it should be understood that a plurality of packaging modules 2a, 4a can be arranged according to requirements, and at least two of the plurality of packaging modules 2a, 4a may have the same or different functional specifications, dimensions (e.g., heights h1, h2 as shown in FIG. 4A), or component arrangements without any special limitation. For instance, a plurality of the semiconductor chips 22 can be stacked in the packaging module 4a, as shown in FIG. 4A.

In addition, the shielding structure 26 has a single metal layer or multiple metal layers (e.g., as shown in FIG. 3A, a shielding structure 36 has a first metal layer 361 and a second metal layer 362), and the shielding structure 26 can be formed by sputtering, vapor deposition, electroplating, chemical plating, or foiling, etc. to cover at least one side of the semiconductor chip 22, but the present disclosure is not limited to the above means. For instance, the shielding structure 26 can be grounded (not shown) or ungrounded (as shown in FIG. 2A-1); or, the shielding structure 26, 36 can be grounded by electrically connecting the grounding circuit in the substrate structure 27 (as shown in FIG. 3A) or the circuit structure 37 (as shown in FIG. 3B, conductive pillars 360 are formed in the packaging layer 25 to electrically connect the shielding structure 26 and the circuit layer 371 of the circuit structure 37). It should be understood that there are many ways to ground the shielding structure 26, 36 to the substrate structure 27 or the circuit structure 37 without any special limitation, and the shielding structure 26, 36 may even not be grounded to the substrate structure 27 (not shown) or the circuit structure 37 (not shown).

Figure 2B:
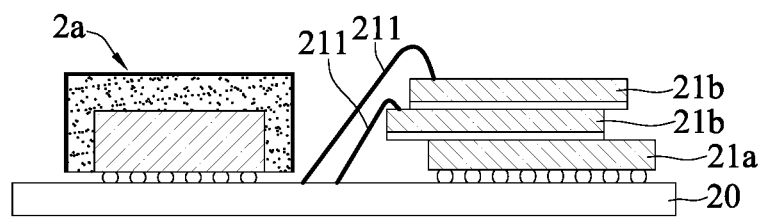

As shown in FIG. 2B, at least another electronic element 21b is stacked on the electronic element 21a, and the another electronic element 21b is also electrically connected to the carrier structure 20 to form a type of system in package (SiP).

In an embodiment, the another electronic element 21b is electrically connected to the circuit layer of the carrier structure 20 via a wire-bonding method (e.g., via a wire 211 as shown in the figures) or other suitable means; in other embodiments, the another electronic element 21b can also be electrically connected to the electronic element 21a therebelow via a flip-chip method.

Figures 1, 2C:
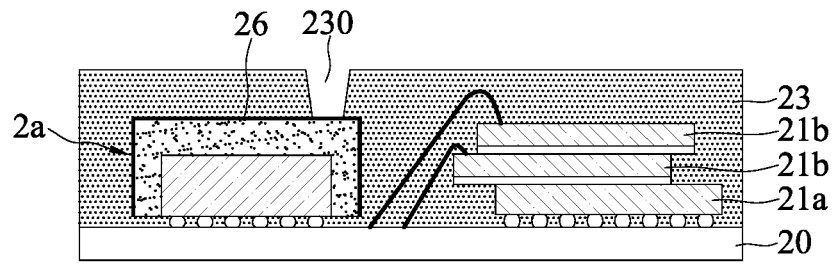
Figures 2, 2C:
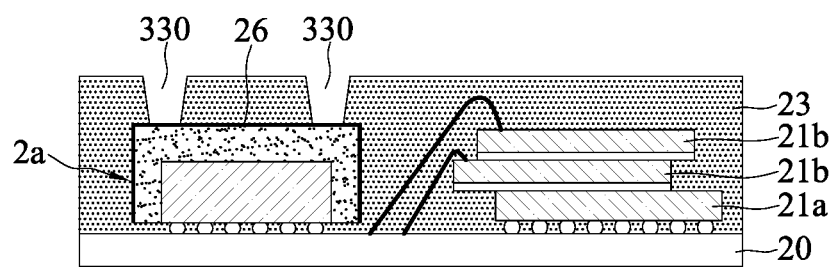

As shown in FIG. 2C-1, an encapsulation layer 23 is formed on the carrier structure 20, such that the encapsulation layer 23 encapsulates the packaging module 2a and the electronic elements 21a, 21b, and a portion of the surface of the shielding structure 26 of the packaging module 2a is exposed from the encapsulation layer 23.

In an embodiment, at least one recess 230 is formed on the encapsulation layer 23, such that the shielding structure 26 of the packaging module 2a is exposed from the recess 230, and a portion of the surface of the shielding structure 26 is exposed from the encapsulation layer 23. It should be understood that a plurality of recesses 330 can be formed on the encapsulation layer 23 according to requirements, as shown in FIG. 2C-2.

Figures 2, 2C, 3:
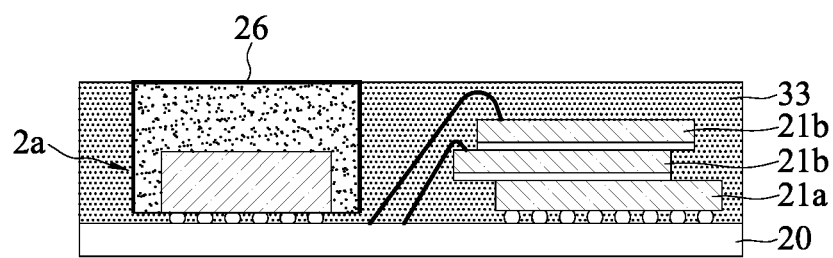

Furthermore, in other embodiments, as shown in FIG. 2C-3, the surface of an encapsulation layer 33 can be flush with the top surface of the packaging module 2a (the shielding structure 26) via a leveling process such as grinding, so that the top surface of the shielding structure 26 is exposed from the encapsulation layer 33.

Figures 1, 2D:
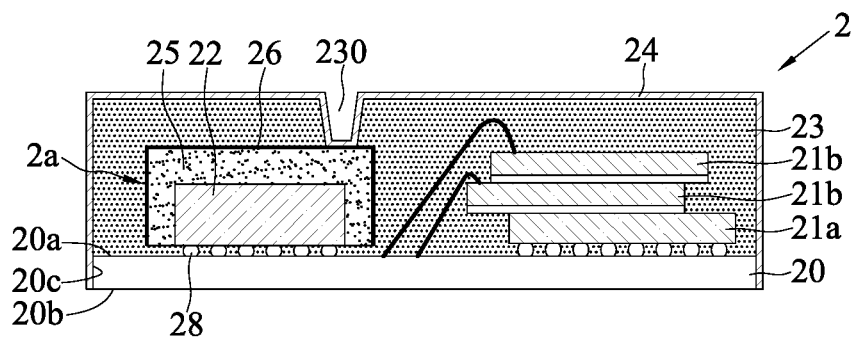
Figures 2, 2D:
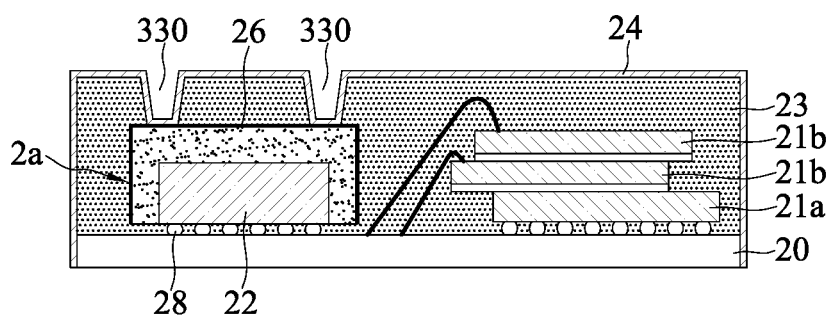
Figures 2, 2D, 3:
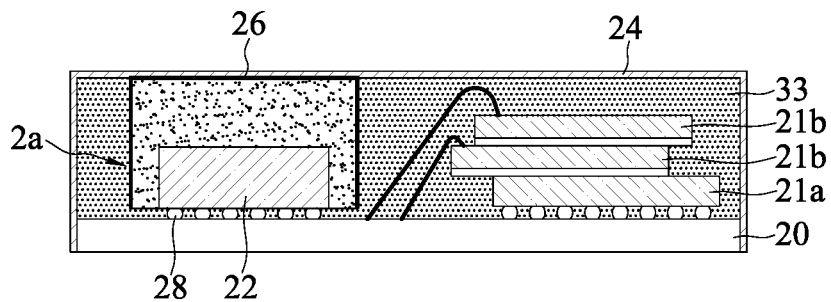
Figures 2, 2D, 3, 4:
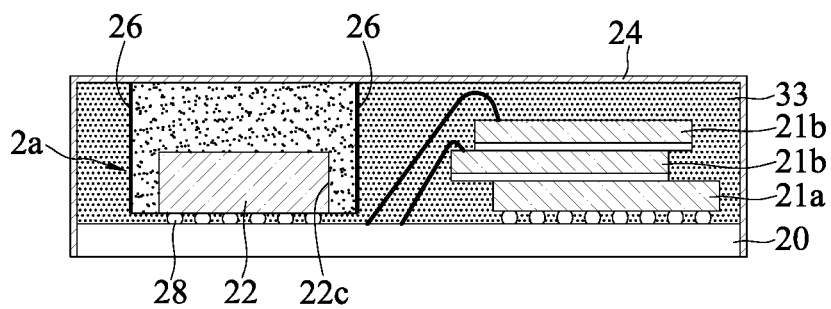

As shown in FIG. 2D-1, subsequent to the manufacturing process shown in FIG. 2C-1, a shielding layer 24 is formed on the encapsulation layer 23 and extends into the recess 230, so that the shielding layer 24 is in contact with the shielding structure 26, thereby obtaining the electronic package 2 of the present disclosure.

In an embodiment, the shielding layer 24 can extend to side surfaces 20c of the carrier structure 20 according to requirements, and the shielding layer 24 is free from being formed on the second side 20b of the carrier structure 20. For instance, the shielding layer 24 such as a metal layer can be formed by sputtering, vapor deposition, electroplating, chemical plating, or foiling, but the present disclosure is not limited to the above means.

Moreover, the shielding layer 24 and/or the shielding structure 26, 36 can be grounded to the carrier structure 20. For instance, the shielding structure 26, 36 is grounded to the carrier structure 20 via the plurality of conductive elements 28.

Also, if the manufacturing process shown in FIG. 2C-2 or FIG. 2C-3 is continued, the electronic package shown in FIG. 2D-2 or FIG. 2D-3 will be obtained. As shown in FIG. 2D-2, in the electronic package, the design of the plurality of recesses 330 allows the electrical strength of the shielding layer 24 to be optimized and the resistance between the shielding layer 24 and the shielding structure 26 to be reduced. Hence, a better electrical connection is formed between the shielding layer 24 and the shielding structure 26 by the plurality of recesses 330. As shown in FIG. 2D-3, the same optimization effect can also be achieved by a large-area contact between the shielding layer 24 and the shielding structure 26. Further, as shown in FIG. 2D-4, it should be understood that the shielding structure 26 can also only surround the side surfaces 22c of the semiconductor chip 22 and is free from being disposed over the semiconductor chip 22.

Figure 4B:
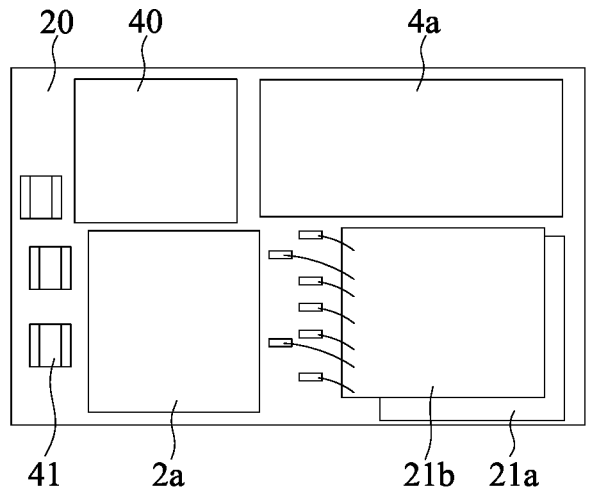
FIG. 4B and FIG. 4C are schematic top plan views showing other embodiments of FIG. 2A-2.
Figure 4C:
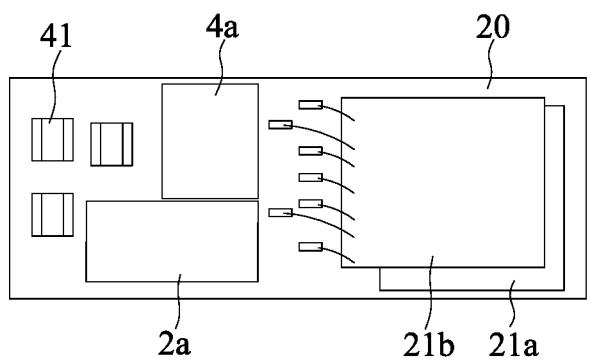

In addition, in an electronic package 4 as shown in FIG. 4A, recesses 230, 430 with different depths can be formed on the encapsulation layer 23 to expose the shielding structure 26 of each of the packaging modules 2a, 4a, so the shielding layer 24 can extend into the recesses 230, 430 to contact the shielding structure 26 of each of the packaging modules 2a, 4a. As shown in FIG. 4B and FIG. 4C, it should be understood that the arrangement of the packaging modules 2a, 4a can be disposed according to requirements, and at least one active element 40 such as a functional chip and/or at least one passive element 41 such as a capacitor, an inductor, or a resistor can be disposed around the packaging modules 2a, 4a, so that the packaging modules 2a, 4a can simultaneously serve as shielding walls between the functional chips (e.g., the active element 40 and the electronic elements 21a, 21b as shown in FIG. 2A-2 or FIG. 4B).

Therefore, in the manufacturing method of the present disclosure, the semiconductor chip 22 in the packaging module 2a, 3a, 3b, 4a is used as a functional chip, so that the packaging module 2a, 3a, 3b, 4a not only has the required functions of a chip, but also has the function of EMI protection via the shielding structure 26, 36, and can serve as a shielding wall via the location design of the packaging module 2a, 3a, 3b, 4a in the electronic package 2, 4. Hence, compared to the prior art, the packaging module 2a, 3a, 3b, 4a of the present disclosure has multiple functions and can replace the conventional shielding wall, so that the packaging module 2a, 3a, 3b, 4a does not additionally occupy the packaging planar region on the first side 20a of the carrier structure 20, such that the dimension of the carrier structure 20 can be reduced (e.g., the area of the first side 20a can be reduced) and the electronic package 2, 4 can meet the miniaturization requirements while reducing the area occupied on the routing region of the carrier structure 20, thereby improving the functions of the end products.

For instance, under the same function, two components such as the semiconductor chip 11 and the shielding wall 12 are required to be arranged on the conventional packaging substrate 10, whereas only a single component such as the packaging module 2a is required to be arranged on the carrier structure 20 of the present disclosure. Hence, other usable regions of the first side 20a of the carrier structure 20 of the present disclosure are more than other usable regions of the surface 10a of the conventional packaging substrate 10.

In addition, compared to the manufacturing method of the conventional shielding wall, the manufacturing method of the present disclosure does not need to additionally fabricate a metal frame and does not need to additionally perform the conventional shielding wall operations such as perforation, copper plating, or the like in the encapsulation layer 23, so as to effectively reduce the manufacturing cost.

Besides, the semiconductor chip 22 in the packaging module 2a, 3a, 3b, 4a is a functional chip, which not only has the functions of a chip, but also has the EMI protection via the shielding structure 26.

The present disclosure also provides an electronic package 2, 4, comprising: a carrier structure 20, at least one electronic element 21, at least one packaging module 2a, 3a, 3b, 4a, an encapsulation layer 23, 33, and at least one shielding layer 24.

The electronic element 21 is disposed on the carrier structure 20 and electrically connected to the carrier structure 20.

The packaging module 2a, 3a, 3b, 4a is disposed on the carrier structure 20 and electrically connected to the carrier structure 20, and the packaging module 2a, 3a, 3b, 4a comprises a semiconductor chip 22 and a shielding structure 26, 36 covering at least one side of the semiconductor chip 22.

The encapsulation layer 23, 33 is formed on the carrier structure 20 to encapsulate the electronic element 21 and the packaging module 2a, 3a, 3b, 4a.

The shielding layer 24 is formed on the encapsulation layer 23, 33 and is in contact with the shielding structure 26, 36.

In an embodiment, the packaging module 2a, 3a, 3b, 4a further comprises a packaging layer 25 encapsulating the semiconductor chip 22, such that the shielding structure 26, 36 is formed on the packaging layer 25, and the packaging module 2a, 3a, 3b, 4a is disposed on the carrier structure 20 via a plurality of conductive elements 28 that are electrically connected to the semiconductor chip 22. Further, the packaging module 3a, 3b further comprises a substrate structure 27 or a circuit structure 37 for carrying the semiconductor chip 22, such that the substrate structure 27 or the circuit structure 37 is disposed on the carrier structure 20 via the plurality of conductive elements 28.

In an embodiment, the encapsulation layer 23 has at least one recess 230, 330 exposing the shielding structure 26. For instance, the packaging module 2a corresponds to a plurality of the recesses 330, as shown in FIG. 2D-2.

In an embodiment, an upper surface of the encapsulation layer 33 is flush with an upper surface of the shielding structure 26, as shown in FIG. 2D-3.

In an embodiment, the shielding structure 26 can also only surround side surfaces 22c of the semiconductor chip 22 and is free from being disposed over the semiconductor chip 22, as shown in FIG. 2D-4.

In an embodiment, a plurality of the packaging modules 2a, 4a are disposed on the carrier structure 20, as shown in FIG. 4B and FIG. 4C. For instance, the height h1 and the height h2 of at least two of the plurality of packaging modules 2a, 4a are different, as shown in FIG. 4A. Further, the encapsulation layer 23 has a plurality of recesses 230, 430 exposing each of the shielding structures 26, and at least two of the plurality of recesses 230, 430 have different depths, as shown in FIG. 4A.

In an embodiment, a plurality of functional chips (such as an active element 40 and electronic elements 21a, 21b) are disposed on the carrier structure 20, such that the packaging modules 2a, 4a are disposed between the plurality of functional chips (such as the active element 40 and the electronic elements 21a, 21b), so that the packaging modules 2a, 4a are served as shielding walls between the plurality of functional chips (such as the active element 40 and the electronic elements 21a, 21b).

In an embodiment, the shielding structure 26, 36 comprises at least one metal layer (e.g., a first metal layer 361 and a second metal layer 362 as shown in FIG. 3A).

To sum up, in the electronic package and manufacturing method thereof of the present disclosure, the packaging module has a semiconductor chip and a shielding structure and is served as a shielding wall. Therefore, the packaging module of the electronic package of the present disclosure can replace the conventional shielding wall, so that the packaging module does not additionally occupy the packaging planar region of the carrier structure, such that the dimension of the carrier structure can be reduced and the electronic package can meet the miniaturization requirements while reducing the area occupied on the routing region of the carrier structure, thereby improving the functions of the end products.

Additionally, the semiconductor chip in the packaging module is a functional chip, which not only has the functions of a chip, but also has the EMI protection via the shielding structure.

The above embodiments are set forth to illustrate the principles of the present disclosure and the effects thereof, and should not be interpreted as to limit the present disclosure. The above embodiments can be modified by one of ordinary skill in the art without departing from the scope of the present disclosure as defined in the appended claims. Therefore, the scope of protection of the right of the present disclosure should be listed as the following appended claims.

What is claimed is:
1. An electronic package, comprising:
a carrier structure;
an electronic element disposed on and electrically connected to the carrier structure;
a packaging module disposed on and electrically connected to the carrier structure, wherein the packaging module comprises a semiconductor chip and a shielding structure covering at least one side of the semiconductor chip;

an encapsulation layer formed on the carrier structure and encapsulating the electronic element and the packaging module, wherein a portion of a surface of the shielding structure is exposed from the encapsulation layer;

a shielding layer formed on the encapsulation layer and in contact with the portion of the surface of the shielding structure exposed from the encapsulation layer; and a plurality of functional chips respectively disposed on the carrier structure, wherein the shielding structure is arranged on side surfaces of the packaging module without directly contacting the carrier structure, and wherein the packaging module is disposed between the plurality of functional chips, and the packaging module is served as a shielding wall between the plurality of functional chips.

2. The electronic package of claim 1, wherein the packaging module further comprises a packaging layer encapsulating the semiconductor chip, wherein the shielding structure is formed on the packaging layer, and the packaging module is disposed on the carrier structure via a plurality of conductive elements.

3. The electronic package of claim 2, wherein the packaging module further comprises a substrate structure or a circuit structure carrying the semiconductor chip, wherein the substrate structure or the circuit structure is disposed on the carrier structure via the plurality of conductive elements.

4. The electronic package of claim 1, wherein a plurality of the packaging modules are disposed on the carrier structure.

5. The electronic package of claim 1, wherein the encapsulation layer has at least one recess exposing the shielding structure.

6. The electronic package of claim 1, wherein the encapsulation layer has a plurality of recesses exposing the shielding structure.

7. The electronic package of claim 1, wherein an upper surface of the encapsulation layer is flush with an upper surface of the shielding structure.

8. The electronic package of claim 1, wherein the shielding structure surrounds side surfaces of the semiconductor chip and is free from being disposed over the semiconductor chip.

9. The electronic package of claim 1, wherein the shielding structure comprises at least one metal layer.

10. A method of manufacturing an electronic package, comprising:

disposing an electronic element and a packaging module on a carrier structure, wherein the electronic element and the packaging module are electrically connected to the carrier structure, wherein the packaging module comprises a semiconductor chip and a shielding structure covering at least one side of the semiconductor chip;

forming an encapsulation layer on the carrier structure, wherein the encapsulation layer encapsulates the electronic element and the packaging module, wherein a portion of a surface of the shielding structure is exposed from the encapsulation layer;

forming a shielding layer on the encapsulation layer, wherein the shielding layer is in contact with the portion of the surface of the shielding structure exposed from the encapsulation layer; and disposing a plurality of functional chips on the carrier structure, wherein the shielding structure is arranged on side surfaces of the packaging module without directly contacting the carrier structure, and wherein the packaging module is disposed between the plurality of functional chips, and the packaging module is served as a shielding wall between the plurality of functional chips.

11. The method of claim 10, wherein the packaging module further comprises a packaging layer encapsulating the semiconductor chip, wherein the shielding structure is formed on the packaging layer, and the packaging module is disposed on the carrier structure via a plurality of conductive elements.

12. The method of claim 11, wherein the packaging module further comprises a substrate structure or a circuit structure carrying the semiconductor chip, wherein the substrate structure or the circuit structure is disposed on the carrier structure via the plurality of conductive elements.

13. The method of claim 10, wherein a plurality of the packaging modules are disposed on the carrier structure.

14. The method of claim 10, wherein the encapsulation layer has at least one recess exposing the shielding structure.

15. The method of claim 10, wherein the encapsulation layer has a plurality of recesses exposing the shielding structure.

16. The method of claim 10, wherein an upper surface of the encapsulation layer is flush with an upper surface of the shielding structure.

17. The method of claim 10, wherein the shielding structure surrounds side surfaces of the semiconductor chip and is free from being disposed over the semiconductor chip.

18. The method of claim 10, wherein the shielding structure comprises at least one metal layer.

* * * * *